United States Patent [19]

Pacifici et al.

[11] 4,395,539
[45] Jul. 26, 1983

[54] AMORPHOUS AROMATIC POLYESTER MODIFIED WITH AMINE AND UV CURABLE COMPOSITION CONTAINING THE SAME

[75] Inventors: James G. Pacifici, Batesville, Ark.; Gordon C. Newland; Howard G. Moore, both of Kingsport, Tenn.

[73] Assignee: Eastman Kodak Company, Rochester, N.Y.

[21] Appl. No.: 401,756

[22] Filed: Jul. 26, 1982

Related U.S. Application Data

[62] Division of Ser. No. 290,460, Aug. 6, 1981, Pat. No. 4,374,716.

[51] Int. Cl.$^3$ .............................................. C08G 69/44
[52] U.S. Cl. ................................ 528/291; 528/308.1; 528/308.6; 528/308.7
[58] Field of Search ..................... 528/288, 291, 308.1, 528/308.6, 308.7

[56] References Cited

U.S. PATENT DOCUMENTS 3,624,181 11/1971 Munakata et al. ................... 528/291
3,652,501 3/1972 Albers et al. .......................... 528/291
4,153,782 5/1979 Coney ................................. 528/308.6

Primary Examiner—Lucille M. Phynes
Attorney, Agent, or Firm—David E. Cotey; Daniel B. Reece, III

[57] ABSTRACT

The present invention provides a novel linear amorphous aromatic polyester comprising units derived from (i) terephthalic acid, (ii) 1,2-propanediol or mixtures of 1,2-propanediol with up to 20 mole percent of ethylene glycol, based upon the total of 1,2-propanediol and ethylene glycol, and (iii) about 5 to 30 mole percent, based upon the total of (i), (ii), and (iii), of a glycol which contains a tertiary amine group, the amine containing glycol having a specified structure and the polyester having an inherent viscosity of about 0.05 to 0.5 dl/g when measured in 60:40 phenol:tetrachloroethane at a concentration of 0.5 g/100 ml at 25° C. The novel polyester is useful as a crosslinking resin and as a photoinitiator for UV curable coating and ink compositions.

Also provided is a specified ultraviolet radiation curable coating composition. The composition comprises a mixture of A. about 4.5 to 49.5% by weight of the novel amine-modified polyester described above;

B. about 50 to 95 percent by weight of a photopolymerizable or photocrosslinkable ethylenically unsaturated compound; and C. about 0.5 to 25 percent by weight of a photoinitiator.

The photoinitiator is selected from the group consisting of benzil, lower alkyl substituted benzil, benzoin ethers, haloalkyl ketones, aromatic ketones, lower alkyl substituted aromatic ketones, aromatic ketones in combination with amines, and mixtures thereof. The ethylenically unsaturated compound is most preferably selected from the group consisting of glycidyl acrylate, glycidyl methacrylate, methyl acrylate, methyl methacrylate, ethyl acrylate, ethyl methacrylate, and mixtures thereof. The coating composition provided by the present invention gives clear insoluble coatings which are useful as protective and/or decorative coatings.

2 Claims, No Drawings

AMORPHOUS AROMATIC POLYESTER MODIFIED WITH AMINE AND UV CURABLE COMPOSITION CONTAINING THE SAME

This is a division of application Ser. No. 290,460 filed Aug. 6, 1981, now U.S. Pat. No. 4,374,716.

BACKGROUND OF THE INVENTION

The present invention relates to a novel amine-modified polyester and to a unique formulation of photocurable binder and coating composition composed of the amine-modified amorphous linear aromatic polyester in combination with photopolymerizable unsaturated monomer.

U.S. Pat. No. 3,624,181 discloses certain amine-modified polyesters which are useful for the formation of fibers which are dyeable with acid dyes. The polyester is derived from terephthalic acid and glycol, the whole or the major portion of which glycol is comprised of a glycol containing a tertiary amino group. The inclusion of units derived from 1,2-propanediol is not specifically disclosed.

Previous work has further shown that linear amorphous polyesters derived from terephthalic acid and 1,2-propanediol or terephthalic acid and mixtures of 1,2-propanediol and ethylene glycol are applicable as binders for UV curable systems. For example, U.S. Pat. No. 4,110,187 discloses an ultraviolet radiation curable composition comprising a solution of 5–50% by weight of a polyester of terephthalic acid esters and a glycol of about 60–100 mole percent 1,2-propylene glycol and 0–40 mole percent ethylene glycol. The disclosed polyesters do not contain tertiary amino groups. The disclosed composition further comprises 95–50% by weight of an ethylenically unsaturated photopolymerizable compound.

Combinations of an aromatic ketone and a tertiary amine have also been described in the prior art. See, for example, U.S. Pat. Nos. 3,673,140, 3,759,807, 3,847,771, and 3,759,809.

None of the prior art mentioned above describes the novel polyester of the present invention or a UV curable coating composition containing an amorphous aromatic polyester having a pendent tertiary amine group, as is provided by the present invention.

The novel amine-modified polyester is useful in the formation of ultraviolet radiation curable coatings and inks. In the coating composition of the present invention, the amine-modified amorphous linear aromatic polyester functions as a crosslinkable resin and also as a component of the photoinitiation system. The coating composition of the present invention obviates the necessity of utilizing a photoinitiator system which comprises a combination of aromatic ketone and a tertiary amine in addition to the polyester resin.

The coating composition of the present invention is useful as a binder and gives clear insoluble coatings which are applicable as protective and/or decorative coatings for substrates such as wood, glass, aluminum, paper, and plastics. When coated on a suitable substrate, a tough glossy finish is obtained when exposed to UV radiation. The hardness and solvent resistance of the finish can be varied by the use of polyfunctional comonomers. These unique formulations release no solvents into the atmosphere and require no heat energy for curing.

SUMMARY OF THE INVENTION

In one aspect of the present invention, there is provided a novel linear amorphous aromatic polyester. The polyester comprises units derived from (i) terephthalic acid, (ii) 1,2-propanediol or mixture of 1,2-propanediol with up to 20 mole percent of ethylene glycol, based upon the total of 1,2-propanediol and ethylene glycol, and (iii) about 5 to 30 mole percent, based upon the total of (i), (ii), and (iii), of a glycol which contains a tertiary amine group. The glycol has the general formula

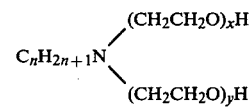

where n is an integer within the range of 1 to 20 and each of x and y is independently an integer within the range of 1 to 30 with the sum of x+y being less than or equal to 60, or the general formula

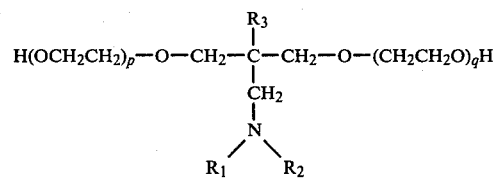

where each of p and q is independently 0 or a positive integer not greater than 10, and where $R_1$ and $R_2$ are lower alkyl groups and can be the same or different and $R_3$ is a lower alkyl group or a group of the formula

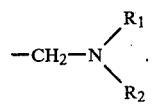

The polyester has an inherent viscosity of about 0.05 to 0.5 dl/g when measured in 60:40 phenol:tetrachloroethane at a concentration of 0.5 g/100 ml at 25° 1 C.

In another aspect, the present invention provides a radiation-curable composition comprising A. about 45 to 49.5 percent by weight of a linear amorphous aromatic polyester derived from (i) terephthalic acid, (ii) 1,2-propanediol or mixtures of 1,2-propanediol with up to 20 mole percent of ethylene glycol, based upon the total of 1,2-propanediol and ethylene glycol, and (iii) about 5 to 30 mole percent, based upon the total of (i), (ii), and (iii), of a glycol which contains a tertiary amine group, the glycol having the general formula

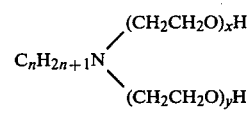

where n is an integer within the range of 1 to 20 and each of x and y is independently an integer within the range of 1 to 30 with the sum of x+y being less than or equal to 60, or the general formula

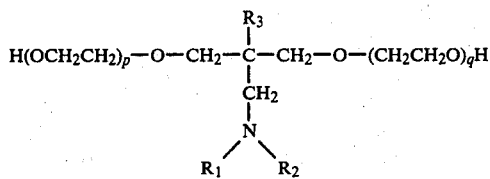

where each of p and q is independently 0 or a positive integer not greater than 10, and where $R_1$ and $R_2$ are lower alkyl groups and can be the same or different and $R_3$ is a lower alkyl group or a group of the formula

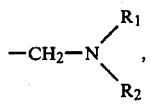

said polyester having an inherent viscosity of about 0.05 to 0.5 dl/g when measured in 60:40 phenol:tetrachloroethane at a concentration of 0.5 g/100 ml at 25° C.;

B. about 50 to 95 percent by weight of a photopolymerizable or photocrosslinkable ethylenically unsaturated compound; and C. about 0.5 to 25 percent by weight of a photoinitiator selected from the group consisting of benzil, lower alkyl substituted benzil, benzoin ethers, haloalkyl ketones, aromatic ketones, lower alkyl substituted aromatic ketones, aromatic ketones in combination with amines, and mixtures thereof.

DETAILED DESCRIPTION OF THE INVENTION

The present invention provides a unique formulation of photocurable binder and coating composition comprising a novel amine modified amorphous linear aromatic polyester in combination with photopolymerizable unsaturated monomer and photoinitiator.

The polyester of the present invention comprises units derived from a terephthalate-yielding moiety (e.g., terephthalic acid or an ester derived from terephthalic acid). Minor amounts of units derived from other aromatic, aliphatic, and cycloaliphatic dicarboxylic acids may be used in combination with those derived from terephthalic acid. Thus, minor amounts of units derived from 4,4-dicarboxydiphenyl, 4,4'-sulfonyldibenzoic acid, 1,2-di-(p-carboxyphenoxy) ethane, naphthylene dicarboxylic acids, etc., may additionally be used.

The polyester further comprises units derived from 1,2-propanediol or mixtures of 1,2-propanediol with up to 20 mole percent of ethylene glycol, based upon the total of 1,2-propanediol and ethylene glycol.

In addition, the polyester comprises units derived from a glycol which contains a tertiary amine group. The units derived from amine-containing glycol may have the general formula

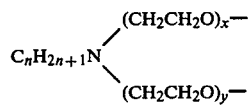

where n is an integer within the range of 1 to 20 and each of x and y is independently an integer within the range of 1 to 30 with the sum of x+y being less than or equal to 60.

Alternatively, the units derived from amine-containing glycol may be of the general formula

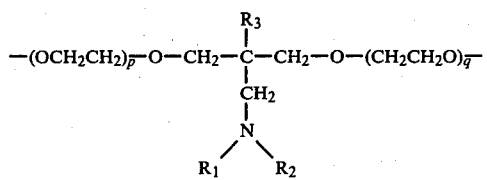

where each of p and q is independently 0 or a positive integer not greater than 10, and where $R_1$ and $R_2$ are lower alkyl groups and can be the same or different and $R_3$ is a lower alkyl group or a group of the formula

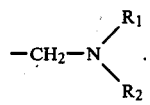

The amine-containing glycol is present in the polyester in a concentration of about 5–30 mole percent, based upon the total of units derived from dicarboxylic acid (e.g., terephthalic acid), units derived from 1,2-propanediol or mixtures thereof with ethylene glycol, and units derived from amine-containing glycol. As will be apparent to one of ordinary skill in the art, the concentration in the polyester of diacid will be substantially equal to the total concentration in the polyester of diol. The concentrations of the units derived from terephthalic acid and the units derived from 1,2-propanediol or mixtures thereof with ethylene glycol can therefore be readily calculated from the chosen concentration of amine-containing glycol in the polyester.

The polyester exhibits an inherent viscosity of about 0.05–0.5 dl/g when measured in 60:40 phenol:tetrachloroethane at a concentration of 0.5 g/100 ml at 25° C. Preferably, the polyester exhibits an inherent viscosity of about 0.1–0.5 dl/g.

The novel amine modified polyester of the present invention has excellent solubility in a number of organic solvents. The solubility characteristics of the polyester makes it useful in formulating radiation curable coating and ink compositions. The polyester of the present invention may also find use in coating compositions, such as that of the present invention described hereinafter, which require no solvent.

The present invention provides a particularly advantageous coating composition which, in addition to the polyester described above, further comprises about 50–95% by weight of a photopolymerizable or photocrosslinkable ethylenically unsaturated compound. Such compounds include lower alkyl and substituted alkyl esters of acrylic and methacrylic acid. Examples of such esters include methyl acrylate, ethyl acrylate, methyl methacrylate, ethyl methacrylate, 2-ethylhexyl methacrylate, isobutyl methacrylate, glycidyl methacrylate, glycidyl acrylate, butyl acrylate, 2-hydroxyethyl acrylate, 2-methoxyethyl acrylate, 2-phenoxyethyl acrylate, 2-hydroxypropyl acrylate, benzyl acrylate, tetrahydrofurfuryl acrylate, etc.

Also useful are polyacrylyl compounds represented by the general formula

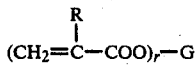

wherein R is hydrogen or methyl and G is a polyvalent alkylene group of the formula

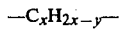

in which X is 2 to 10 and y is 0 to 2. For example, G may be (a) divalent alkylene such as $C_xH_{2x}$ when y=0, (i.e., $-C_2H_4-$, $-C_3H_6-$, $-C_5H_{10}-$, neo—$C_5H_{10}-$, and the like);

(b) trivalent alkylene such as $-C_xH_{2x-1}-$ when y=1, (i.e.,

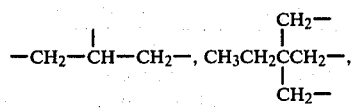

and the like); or (c) tetravalent alkylene such as $-C_2H_{2x-2}-$ when y=2, (i.e.,

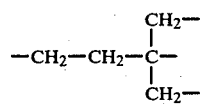

and the like).

Alteratively, G may be a divalent $-(C_xH_{2x}O)_tC_xH_{2x}-$ group in which t is 1 to 10 (e.g., oxyethylene, oxypropylene, oxybutylene, polyoxyethylene, polyoxypropylene, polyoxybutylene, and polyoxyethylene-oxypropylene). In the above formulas, r is the valence of G and can be from 2 to 4.

Also useful are allyl acrylates and methacrylates (e.g., allyl methacrylate, allyl acrylate, dialkyl acrylate, etc.).

Other unsaturated compounds useful in the present invention include vinyl esters such as vinyl acetate; vinyl and vinylidine halides, such as vinyl chloride and vinylidene chloride; vinyl aromatic compounds, such as styrene, alkyl styrenes, halostyrenes, and divinyl benzenes; and substituted and unsubstituted acrylamides, such as acrylamide and diacetone acrylamide.

The ethylenically unsaturated compound included in the composition of the present invention is preferably selected from the group consisting of glycidyl acrylate, glycidyl methacrylate, methyl acrylate, methyl methacrylate, ethyl acrylate, ethyl methacrylate and mixtures thereof.

The coating composition of the present invention further comprises a photoinitiator selected from the group consisting of benzil, lower alkyl substituted benzil, benzoin ethers, haloalkyl ketones, aromatic ketones, lower alkyl substituted aromatic ketones, aromatic ketones in combination with amines, and mixtures thereof.

Such photosensitizers are well known in the art and are disclosed in various publications and patents such as U.S. Pat. Nos. 3,686,084, 3,692,560, 3,728,377, 3,878,065, 3,912,606, 3,962,055, 3,962,056, 3,988,288, 4,012,302, and previously mentioned patents, all of which are incorporated herein by reference. Specific examples of these photoinitiators are benzil, isopropyl benzoin ether, isobutyl benzoin ether, diethoxy acetophenone, benzophenone, 4,4'-dimethylbenzophenone, 4,4'-bis(chloromethyl)benzophenone, 3,4-bis(chloromethyl)benzophenone, α-chloroacetophenone, 4-tertbutyl-α,α,α-trichloroacetophenone, benzophenone/methyl diethanol amine, etc.

The photoinitiator is preferably selected from the group consisting of benzophenone, lower alkyl substituted benzophenone, and mixtures thereof.

The coating composition of the present invention comprises approximately 50-95% by weight of the ethylenically unsaturated compound. Preferably, the ethylenically unsaturated compound is present in an amount of about 60-80% by weight. The composition further comprises about 0.5-25% by weight of the photoinitiator. Preferably, the photoinitiator is present in an amount of about 1-10% by weight. The remainder of the composition is comprised of the linear amorphous aromatic polyester. That is, the polyester is present in an amount of about 0.5-49.5% by weight (preferably, about 20-40% by weight). For example, a preferred composition comprises 60-80% by weight of the ethylenically unsaturated compound, about 1-10% by weight of the photoinitiator, and about 19-39% by weight of the polyester.

The coating composition of the present invention may be applied by any conventional technique onto substrates such as wood, glass, aluminum, paper, and plastics. Conventional application techniques include the use of a doctor blade, coating curtains, etc. The article is then exposed to high intensity UV light for a period of time sufficient to polymerize the composition. A tough film is thereby formed, and the article is ready for use.

The coatings thus formed have several advantages over previous coatings. The coatings are tough and have superior impact strength to cellulosic coatings. No drying or curing ovens are needed to cure the polymer coating. Pollution is reduced to a minimum because there are no carrier solvents which may be released into the atmosphere. Furthermore, the incorporation of the tertiary amine group into the polyester structure obviates the need for the use of a photoinitiator system which comprises both an aromatic ketone and a tertiary amine compound in addition to the polyester. That is, the inclusion of the tertiary amine group in the polyester structure allows the polyester to function both as a crosslinking resin and also as a component of the photoinitiator system.

The following Example is illustrative of the present invention.

EXAMPLE

Linear amorphous aromatic polyesters were prepared by standard polycondensation reactions. The polyesters had the general formula T(X)Y where T represents units derived from terephthalic acid, X represents units derived from Ethomeen 18/25, and Y represents units derived from 1,2propanediol. Ethomeen 18/25, available commercially from Armour Chemicals, is an amine-containing glycol of the formula

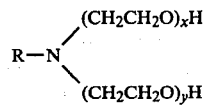

where R is derived from stearic acid (i.e., contains 18 C atoms) and x+y=15. Dimethylterephthalate (97.1 g, 0.5 mole), Ethomeen 18/25 (74.7 g, 0.1 mole) and 1,2-propanediol (152.2 g, 2.0 mole) were placed in a reaction flask. Also charged were 1.55 ml of a solution of zinc acetate in butanol sufficient to yield 50 ppm of zinc in the polymer product and 0.2 ml of a solution of titanium isopropoxide in butanol sufficient to yield 50 ppm of titanium in the polymer product. The reaction mixture was flushed with nitrogen and then heated under nitrogen at 200°–210° C. for 7 hours. The theoretical volume of methanol was collected, whereupon the reaction temperature was rapidly increased to 230° C. The pressure was reduced to 0.1 mm for 25 minutes. The product was then cooled and collected. The resulting polymer is listed as Composition No. 7 in Table I. The other compositions of Table I were prepared in like manner. The inherent viscosities of the various compositions are also listed in Table I.

TABLE I

| | Composition (Wt. %) | | | |
|---|---|---|---|---|
| | T | X | Y | Inherent Viscosity (dl/g) |
| 1. | 50 | 5 | 45 | 0.286 |
| 2. | 50 | 5 | 45 | 0.138 |
| 3. | 50 | 5 | 45 | 0.202 |
| 4. | 50 | 10 | 40 | 0.143 |
| 5. | 50 | 10 | 40 | 0.206 |
| 6. | 50 | 20 | 30 | 0.179 |
| 7. | 50 | 20 | 30 | 0.125 |

The inherent viscosities were measured in 60:40 phenol:tetrachloroethane at a concentration of 0.5 g/100 ml at 25° C.

The polyester compositions listed in Table I were dissolved in a 1:1 mixture of hydroxypropyl acrylate:-neopentyl glycol diacrylate at a concentration of 30 g/100 ml. Benzophenone and 4,4'-dimethylbenzophenone were added in a concentration of 3% by weight as photoinitiators to the compositions as shown in Table II. The heat of polymerization of each of the compositions was measured under nitrogen and/or air by photocalorimetry. The results are listed in Table II.

TABLE II

| Polyester Composition | Benzophenone k | | 4,4'-Dimethylbenzophenone k | |
|---|---|---|---|---|
| | $N_2$ | Air | $N_2$ | Air |
| 1 | .036 | | | |
| 2 | .051 | | .059 | .026 |
| 3 | .043 | | | |
| 4 | .057 | | .078 | .045 |
| 5 | .053 | | | |
| 6 | .061 | | .086 | .062 |
| 7 | .066 | .083 | .085 | .066 |

It can be seen from a review of the data of Table II that the heat of polymerization increases as the concentration of the amine-containing glycol in the polyester increases. An increase in the heat of polymerization indicates an increase in the degree of polymerization. Therefore, it can be seen that the inclusion of the amine-containing glycol in the polyester is effective as a means of initiating crosslinking between the polyester and the photopolymerizable ethylenically unsaturated compound.

It can further be seen from an examination of Table II that 4,4'-dimethylbenzophenone is more effective as a photoinitiator for the system under nitrogen than is benzophenone.

The compositions from Table I containing benzophenone photoinitiator were coated in a thickness of 2 mils on Penetration-Opacity Panels Form 016 and cured with a PPG irradiator under a $N_2$ atmosphere. The samples were passed through the apparatus on a continuous belt at belt speeds of 25 ft/min (Compositions 1–3), 33 ft/min (Compositions 4 and 5), and 50 ft/min (Compositions 6 and 7). The cured coatings were examined, and the results are listed in Table III.

TABLE III

| Composition | Acetone Resistance | Remarks |
|---|---|---|
| 1 | Good | Smooth, hard surface |
| 2 | Good | Smooth, hard surface |
| 3 | Good | Smooth, hard surface |
| 4 | Excellent | Smooth, hard surface |
| 5 | Excellent | Smooth, hard surface |
| 6 | Excellent | Smooth, hard surface |
| 7 | Excellent | Smooth, hard surface |

All of the compositions resulted in smooth, hard surfaces, and in "good" to "excellent" solvent resistance. The solvent resistance is an indication of the degree of crosslinking of the coating. The resistance of the cured coating to solvents such as acetone increases in direct proportion to the degree of crosslinking. Therefore, it can be seen that the compositions of the present invention provide effective crosslinking by ultraviolet irradiation.

The invention has been described in detail with particular reference to preferred embodiments thereof, but it will be understood that variations and modifications can be effected within the spirit and scope of the invention.

We claim:

1. A novel linear amorphous aromatic polyester comprising units derived from (i) terephthalic acid, (ii) 1,2-propanediol or mixtures of 1,2-propanediol with up to 20 mole percent of ethylene glycol, based upon the total of 1,2-propanediol and ethylene glycol, and (iii) about 5 to 30 mole percent, based upon the total of (i), (ii), and (iii), of a glycol which contains a tertiary amine group, said glycol having the general formula

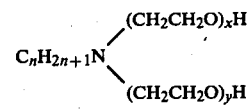

where n is an integer within the range of 1 to 20 and each of x and y is independently an integer within the range of 1 to 30 with the sum of x+y being less than or equal to 60, or the general formula

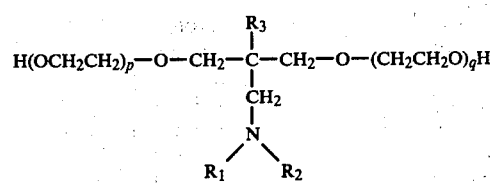

where each of p and q is independently 0 or a positive integer not greater than 10, and where $R_1$ and $R_2$ are lower alkyl groups and can be the same or different and R₃ is a lower alkyl group or a group of the formula

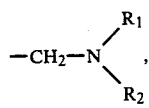

said polyester having an inherent viscosity of about 0.05 to 0.5 dl/g when measured in 60:40 phenol:tetrachloroethane at a concentration of 0.5 g/100 ml at 25° C.

2. The polyester of claim 1 wherein said polyester exhibits an inherent viscosity of about 0.1 to 0.5 dl/g when measured at a concentration of 0.5 g/100 ml in 60:40 phenol:tetrachloroethane at 25° C.

* * * * *